United States Patent [19]

Everett

[11] Patent Number: 4,602,288
[45] Date of Patent: Jul. 22, 1986

[54] INTERMEDIATE FREQUENCY SAW FILTER WITH NYQUIST PHASE MODULATION CORRECTION

[75] Inventor: Peter G. Everett, Wood Dale, Ill.

[73] Assignee: Zenith Electronics Corporation, Glenview, Ill.

[21] Appl. No.: 554,151

[22] Filed: Nov. 21, 1983

[51] Int. Cl.[4] .......................... H04N 5/62; H03N 3/08
[52] U.S. Cl. ..................................... 358/197; 358/144; 333/194; 333/196; 310/313 C
[58] Field of Search ............... 333/193, 194, 195, 196, 333/150, 154, 155; 310/313 R, 313 B, 313 C, 313 D; 358/197, 198, 904, 143, 144

[56] References Cited

U.S. PATENT DOCUMENTS

| 4,030,050 | 6/1977 | Deacon et al. | 333/195 |
| 4,237,485 | 12/1980 | Saito et al. | 358/197 |
| 4,393,358 | 7/1983 | DeVries | 333/195 X |

FOREIGN PATENT DOCUMENTS

| 0006054 | 12/1979 | European Pat. Off. | 333/193 |
| 0823389 | 2/1955 | United Kingdom | 358/197 |

OTHER PUBLICATIONS

Nakagawa, Y. et al., "Temperature-Stable Surface Acoustical Wave Substrate" *The Transaction of the IEEE of Japan*, vol. E62, #11, Nov. 1979, pp. 790-791.
Takahashi, S. et al., "SAW IF Filter on LiTaO$_3$ for Color TV Receiver" *IEEE Transaction on Consumer Electronic;* vol. CF-24, #3, 8/1978; pp. 337-346.
Fockens, P. et al., "Intercarrier Buzz Phenomena Analysis and Uses"; *IEEE Trans on Carrier Electronic;* vol. CG-27, #3, Aug. 1981, pp. 381-395.

*Primary Examiner*—Eugene R. LaRoche
*Assistant Examiner*—Benny T. Lee

[57] ABSTRACT

The frequency response of an intermediate frequency filter for an intercarrier sound television receiver is modified to provide a substantially constant gain response portion over a predetermined range of frequencies centered about the 45.75 MHz intermediate frequency picture carrier. Picture carrier phase modulation induced by the Nyquist slope of the conventional intermediate frequency response is thereby eliminated over the predetermined frequency range reducing audio "buzz" by decreasing the phase modulation transferred to the 4.5 MHz intercarrier sound signal by the intermediate frequency picture carrier. In a preferred embodiment, the modified intermediate frequency response is established by a surface acoustic wave filter.

7 Claims, 5 Drawing Figures

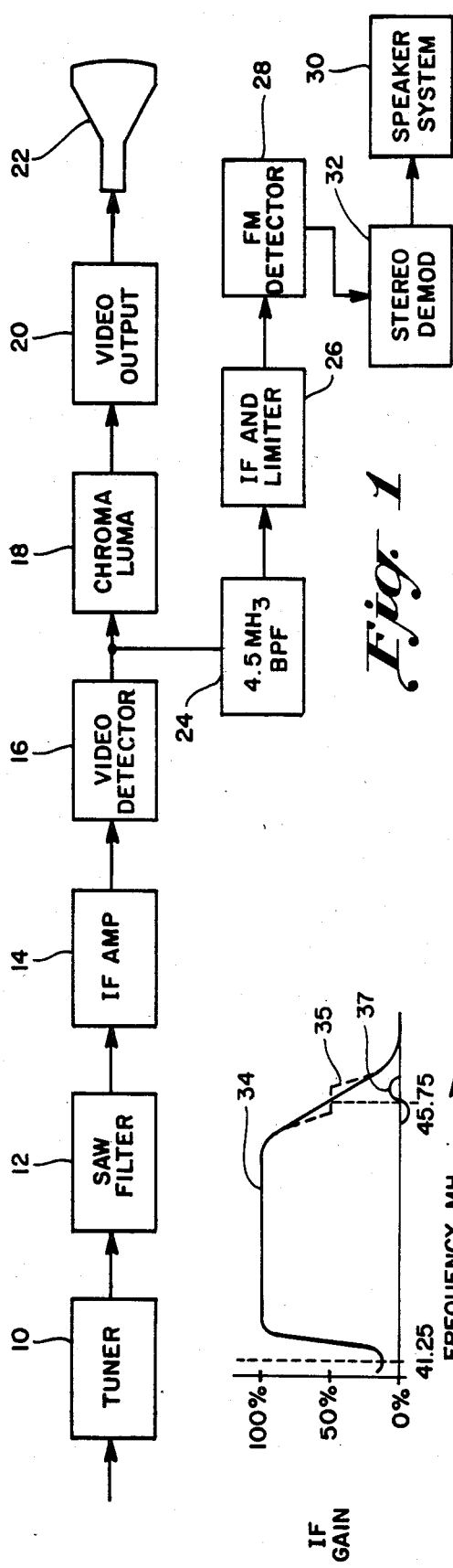
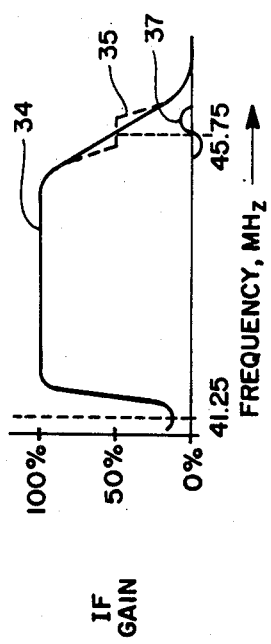
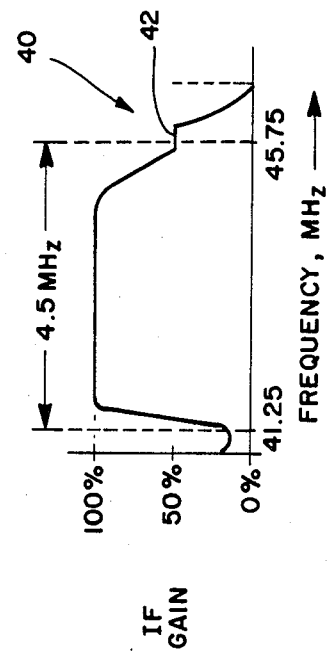

INTERMEDIATE FREQUENCY SAW FILTER WITH NYQUIST PHASE MODULATION CORRECTION

CROSS-REFERENCE TO RELATED APPLICATIONS

This application is related to application Ser. No. 554,154, filed Nov. 21, 1983, and entitled "Intermediate Frequency Filter With Nyquist Phase Modulation Correction".

BACKGROUND OF THE INVENTION

The present invention relates generally to television receiver sound systems and particularly concerns an improved technique for reducing objectional "buzz" in the reproduced sound signal of an intercarrier sound television receiver.

Intercarrier sound systems are currently used almost exclusively in television receivers. The intercarrier technique for reproducing a sound signal in a television receiver is based on the fact that the frequency modulated sound carrier and the amplitude modulated picture carrier of a broadcast television signal are always spaced from each other by a fixed amount, such as 4.5 MHz in the United States. This characteristic of the transmitted sound and picture carriers allows the two signals to be heterodyned in a television receiver, normally in the video detector stage following IF filtering and amplification, to produce a fixed 4.5 MHz intercarrier sound signal which is subsequently processed in the receiver's intercarrier and audio circuits.

Although intercarrier sound television systems of the foregoing type provide a number of advantages, they are also subject to a number of undesirable phenomena. One such undesirable phenomenon is known as incidental carrier phase modulation (ICPM) which may result in the reproduced sound signal being characterized by an objectional "buzz". ICPM distortion can result from a number of sources all of which have the affect of imparting undesired video frequency phase modulation onto the picture carrier, which phase modulation is subsequently transferred to the 4.5 MHz intercarrier sound signal in the receiver. The phase modulation so transferred to the 4.5 Mhz intercarrier sound signal results in "buzz" distortion of the reproduced sound signal for phase modulation frequencies that cover a range less than twice the range of the composite baseband audio signal. For example, level dependent phase modulation of the picture carrier by the video signal frequently occurs in broadcast transmitters although this problem can be somewhat controlled by providing suitable correction circuits at the transmitter. The tuning stage of most television receivers may also introduce some ICPM primarily due to the operation of the automatic frequency control circuits and due to reverse mixer feedthrough. Fortunately, the ICPM produced by the tuner is imparted equally to both the picture and sound carriers and therefore normally cancels when the two carriers are heterodyned.

Another source of ICPM results from the so-called Nyquist slope characterizing the IF response of a television receiver about the picture carrier. Television signals are transmitted using a technique referred to as vestigial-side-band transmission wherein the lower picture frequencies (up to about 0.75 MHz) are transmitted as a double-side-band signal and the higher picture frequencies (between about 1.25 MHz and 5.0 MHz) above the picture carrier are transmitted as a single-side-band signal. To compensate for the linear amplitude distortion that would otherwise be produced by the vestigial-side-band transmission of the picture signal, the IF response of the receiver is tailored to reduce the received double-side-band component by an average of fifty percent relative to the received single-side-band component. This is done by imparting maximum IF response to the single-side-band frequencies and by imparting approximately fifty percent of maximum IF response to the IF picture carrier while substantially linearly increasing the IF response therefrom to maximum for one side-band of the double-side-band component and substantially linearly reducing the IF response therefrom to zero for the other side-band. While this IF response characteristic effectively compensates for linear amplitude distortion resulting from the vestigial-side-band nature of the television signal transmission, it also promotes video frequency ICPM of the picture carrier by effecting different gain characteristics for the two side-bands of the picture carrier double-side-band component. As previously explained, this ICPM of the picture carrier is subsequently transferred to the 4.5 MHz intercarrier sound signal and can result in an objectionable "buzz" in the reproduced audio signal. This audio "buzz", while even noticeable in monaural television sound reproduction systems, is particularly objectionable in the case of stereo sound systems which are designed to strongly detect the increased frequency components of the composite stereo baseband signal.

It is therefore a basic object of the present invention to provide an improved intercarrier sound television receiver.

It is a more specific object of the invention to provide a facility in an intercarrier sound television receiver for reducing the effect of ICPM introduced onto the IF picture carrier by the Nyquist slope of the IF response of the receiver.

It is a further object of the invention to provide a SAW IF filter for use in an intercarrier sound television receiver for providing an improved IF response characteristic adapted for eliminating Nyquist slope induced "buzz" from the audio reproduced by the receiver.

BRIEF DESCRIPTION OF THE DRAWINGS

The features of this invention which are believed to be novel are set forth with particularity in the appended claims. The invention, together with its objects and the advantages thereof, may best be understood by reference to the following description taken in conjunction with the accompanying drawings, in which like reference numerals identify like elements in the several figures and in which:

FIG. 1 is a block diagram of portions of a conventional intercarrier sound television receiver;

FIG. 2 is a graphical depiction of the prior art IF response characteristic of a television receiver;

FIG. 3 is a graphical depiction of an imporved IF response characteristic for an intercarrier sound television receiver according to the present invention;

FIG. 5 is a graphical depiction useful in understanding the design of the SAW filter of FIG. 4.

DESCRIPTION OF THE PREFERRED EMBODIMENT

Figure 4:
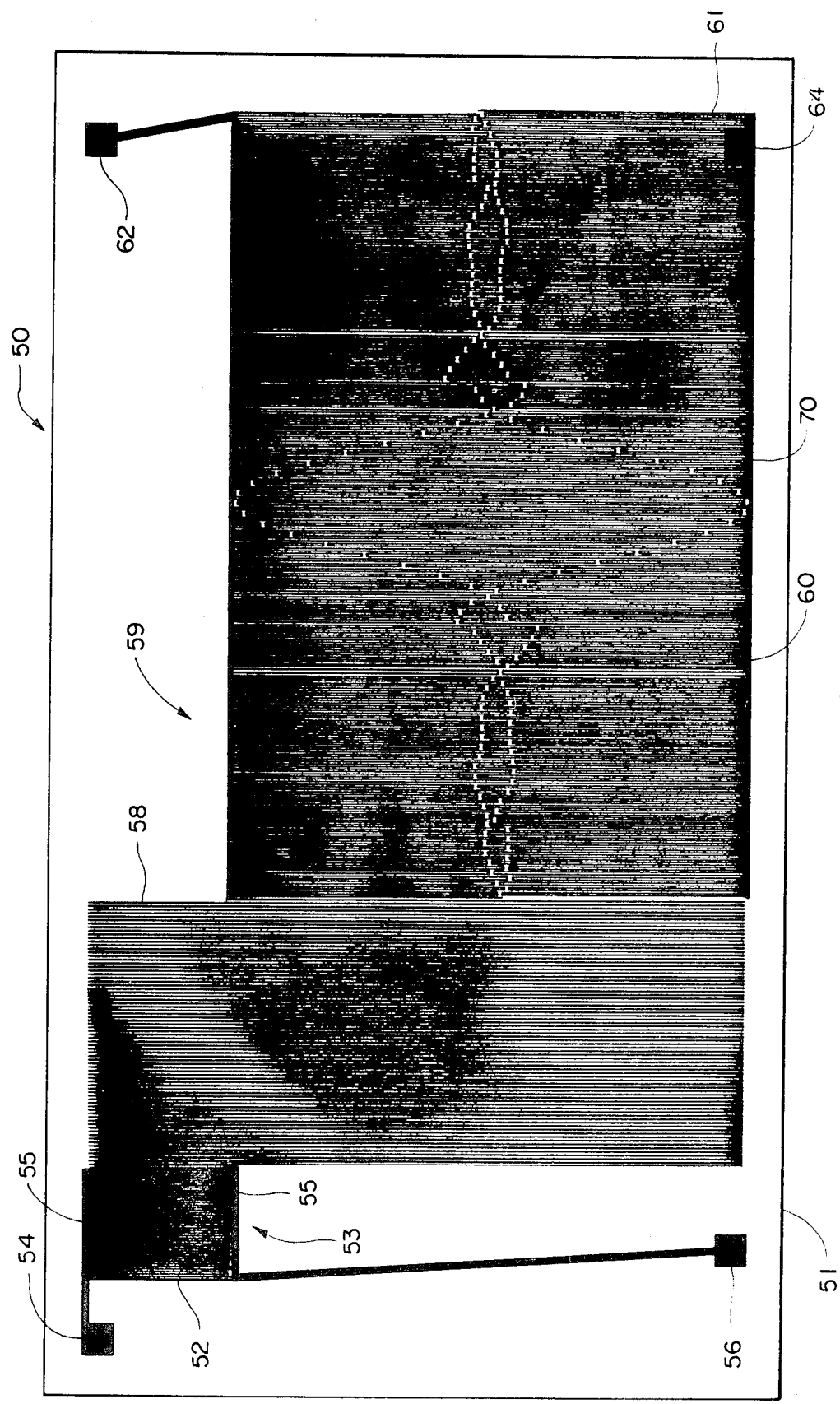
FIG. 4 shows a SAW filter designed for effecting the improved IF response shown in FIG. 3.

FIG. 1 is a block diagram illustrating various portions of a conventionally configured television receiver. The television receiver includes a tuner 10 for converting a received RF television signal into a corresponding intermediate frequency (IF) signal in which the 4.5 MHz intercarrier spacing between the sound and picture carriers is maintained. In particular, the received sound carrier is converted to a 41.25 MHz IF sound carrier and the received picture carrier is converted to a 45.75 MHz IF picture carrier. The output of tuner 10 is coupled to an IF stage comprising a surface acoustic wave (SAW) filter 12 and an IF amplifier 14. As will be explained in further detail below, SAW filter 12 establishes a desired frequency selectivity characteristic of IF response for the IF stage.

The output of IF amplifier 14 is applied to a video detector 16 which may comprise an envelope-type detector or a quasi-synchronous-type detector. In either event, video detector 16 functions to convert the IF picture signal to a corresponding baseband video signal which is processed by a chroma-luma circuit 18 and a video output stage 20 for driving a cathode ray tube 22. Video detector 16, if of the envelope type, also functions to heterodyne the IF picture and sound carriers to produce a 4.5 MHz intercarrier sound signal which is applied to the receiver's intercarrier sound circuits including a 4.5 MHz bandpass filter 24. In the case of a quasi-synchronous-type video detector, the IF signal is branched off into a reference channel where it is used to generate a local oscillator signal at the picture carrier frequency. The bandwidth of the reference channel is usually wider than double the composite audio baseband frequency range. The local oscillator signal at 45.75 MHz is applied to a first input port of a multiplier-type synchronous detector which produces a 4.5 MHz intercarrier signal at its output when the IF signal, including the 41.25 MHz IF sound carrier, is applied to its second input port.

In either case, the 4.5 MHz intercarrier sound signal is coupled by bandpass filter 24 to an IF amplifier and limiter stage 26 and therefrom to an FM detector 28. The output of FM detector 28, after suitable amplification, may be coupled directly to the receiver's speaker system 30, typically via a de-emphasis network, in the case of a monaural sound television receiver or through a stereo demodulator 32 in the case of a stereophonic sound television receiver.

FIG. 2 illustrates a conventional IF response characteristic 34 established by SAW filter 12 of the IF stage. It will be noted that this characteristic provides for an overall channel bandwidth of about 6 MHz with the IF sound carrier at 41.25 MHz being subject to a relative gain of between about five to ten percent and the IF picture carrier at 45.75 MHz being situated at the center of the so-called Nyquist slope 36 and being subject to a relative gain of about fifty percent. The Nyquist slope portion 36 of the IF response characteristic 34 is provided to compensate for the vestigial-side-band nature of the received television signal. In particular, the lower picture frequencies (±0.75 MHz about the picture carrier) are transmitted as a double-side-band signal while the higher picture frequencies (between about 1.25 MHz and 5.0 MHz) above the picture carrier are transmitted as a single-side-band signal. The normal IF response characteristic 34 of the receiver includes the Nyquist slope portion 36 to compensate for the linear amplitude distortion which would otherwise be produced in the receiver by this vestigial-side-band signal if the receiver had a flat response over the entire 6 MHz channel. The Nyquist slope portion 36 is centered about the 45.75 MHz IF picture carrier and substantially linearly decreases from maximum IF gain to nearly zero IF gain for the double-side-band component of the picture signal. Since the single-side-band component of the picture signal is subject to maximum IF gain, it will be appreciated that the double-side-band component is reduced by an average of fifty percent relative to the single-side-band component thereby compensating for the vestigial-side-band transmission.

The differential gain imparted to the two side bands of the double-side-band component of the picture signal by the Nyquist slope portion 36 of the IF response characteristic 34 serves to undesirably phase modulate the 45.75 MHz IF picture carrier at a video frequency rate. Due to the regular nature of the television signal, the spectrum of this phase modulation consists primarily of vertical rate sidebands of the picture carrier together with a plurality of horizontal rate harmonics each having vertical rate harmonics as sidebands thereof. The video rate phase modulation so imparted to the IF picture carrier is subsequently transferred to the 4.5 MHz intercarrier sound signal by the video detector 16 and can result in an annoying "buzz" in the audio signal reproduced by speaker system 30. Such audio "buzz" is noticeable but not too objectionable in the reproduced audio signal of a monaural television receiver. However, in the case of television receivers designed for processing stereo sound and second audio program signals which are modulated on subcarriers extending the composite audio baseband bandwidth to about ±50 KHz and ±90 KHz respectively, the "buzz" may become particularly objectionable. In particular, the higher horizontal rate "buzz" components of the 4.5 MHz intercarrier sound signal are strongly reproduced by the audio circuits of such receivers designed for processing the stereo and second audio program subcarrier signals.

FIG. 3 illustrates a modified IF response characteristic 40 according to the present invention for reducing audio "buzz" resulting from the phase modulation imparted to the IF picture carrier by the Nyquist slope portion 36 of the conventional IF response characteristic 34 of FIG. 2. Modified IF response characteristic 40 is largely similar to the conventional response 34 except that the Nyquist slope portion 36 includes a constant or flat gain portion or shelf 42 symmetrically disposed about the 45.75 MHz IF picture carrier. It will be appreciated that the effect of constant gain shelf 42 is to impart equal IF gain to the two side-bands of the double-side-band component of the picture signal over a frequency range defined by the horizontal extent of shelf 42. These double-side-band frequencies are therefore not subjected to differential IF gain and do not contribute to phase modulation of the 45.75 MHz IF picture carrier. Preferably, the IF response characteristic 40 is configured such that the shelf 42 extends over a frequency range equal to at least twice the frequency range of the received composite baseband audio signal. Thus, shelf 42 may extend about 100 KHz above and below the 45.75 MHz IF picture carrier so as to encompass the full range of baseband audio frequencies expected to be encountered in television stereo sound and second audio program applications.

As explained above, the shelf 42 of IF response characteristic 40 results in the absence of Nyquist slope induced IF picture carrier phase modulation in response to video frequencies which are spaced approximately 100 KHz above and below the 45.75 MHz picture carrier. There will therefore be no Nyquist slope induced phase modulation transferred to the 4.5 MHz intercarrier sound signal over this frequency range at the output of video detector 16. Thus, the 4.5 MHz intercarrier sound signal coupled to the remaining circuits of the sound channel will be substantially free of any Nyquist slope induced phase modulation over the range of desired audio modulation frequencies thereby effectively reducing the "buzz" present in the reproduced audio signal.

FIG. 4 illustrates a presently preferred embodiment of a SAW filter 50 designed for providing the improved IF response characteristic 40 shown in FIG. 3. SAW filter 50 comprises a piezoelectric substrate 51 on the surface of which are printed, in the form of metallic lines, an interdigital input or sending transducer 53 having finger pairs 52, bus bars 55, and a pair of input terminals 54 and 56 for coupling to the output of tuner 10. Also printed on substrate 51 is a multistrip coupler 58 for coupling input transducer 53 to an output or receiving transducer 59. Output transducer 59 has an array of interdigitated finger pairs 61, bus bars 60, and a pair of output terminals 62 and 64 for coupling to the input of IF amplifier 14. The finger pairs of at least one of the transducers, in this case finger pairs 61 of output transducer 59, are apodized to establish the desired frequency response characteristic of the transducer system; that is to say the over-lapping regions of the transducer fingers are length-weighted in a desired pattern along the horizontal axis of the transducer. Both transducers could be apodized, if desired; but often one of them, in this case input transducer 53, has uniform fingers. The transducer fingers 52 and 61 are preferably split, which improves their acoustic reflection properties. The use of split finger transducers is well known in the art as exemplified by U.S. Pat. No. 3,727,155.

As is well known in the art, the apodization pattern of output transducer 59 is primarily responsible for establishing the frequency response characteristic of the filter. This apodization pattern is normally derived by taking the Fourier transform of the desired frequency domain response to establish the corresponding time domain response which then defines the required transducer apodization pattern. For example, SAW filters for effecting the conventional IF response characteristic 34 of FIG. 2 are well known in the art and typically comprise an apodized output transducer having a centrally located major lobe and mirror image secondary lobes on either side of the major lobe. The conventional IF response characteristic of such a SAW filter may be modified to incorporate constant gain shelf 42 by adding selected Fourier components to the Fourier transform of the conventional IF response corresponding to the desired frequency response modification.

In particular, referring to FIG. 5, there is shown in solid line the conventional IF response characteristic 34 produced by prior art SAW filters. Dashed line 35 shows the modification required in response characteristic 34 for achieving the improved response 40 of the present invention shown in FIG. 3. This modification may be effected by combining the conventional response characteristic 34 with a suitable modifying response represented in FIG. 5 by reference numeral 37.

Modifying response 37 extends over a frequency range of about 100 KHz above and below 45.75 MHz and resembles one cycle of a sine-wave alternating about the 0% IF gain axis, the negative polarity portion of which occupies a 100 KHz frequency range below 45.75 MHz and the positive polarity portion of which occupies a 100 KHz frequency range above 45.75 MHz. It will be appreciated that the combination of modifying response 37 with the conventional IF response 34 will result in the improved response 40 including shelf 42 as shown in FIG. 3.

The apodization pattern of output transducer 59 of SAW filter 50 results from the combination of the Fourier transform of modifying response 37 with the Fourier transform of the conventional IF response 34. This apodization pattern includes a major central lobe 70 and a series of three secondary lobes on either side thereof, the secondary lobes on one side being a mirror image of the secondary lobes on the other side. Since output transducer 59 has four more secondary lobes than the output transducer of a conventional SAW IF filter, it is necessary to increase the length of the transducer by adding approximately 90 finger pairs thereto while also increasing its width about 4.2 times to provide for sufficient finger overlap. This increase in width of transducer 59 necessitates a corresponding increase in width of multristrip coupler 58.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. An acoustic surface wave intermediate frequency filter for an intercarrier sound television receiver comprising a substrate having formed thereon a plurality of transducers including at least an input transducer for receiving an intermediate frequency television signal having an intermediate frequency picture carrier and an output transducer, said transducers being configured for establishing for said filter a television signal intermediate frequency response characteristic including a Nyquist slope portion centered about said intermediate frequency picture carrier, said Nyquist slope portion of the intermediate frequency response characteristic being characterized by a substantially constant gain response over a predetermined range of frequencies centered about said intermediate frequency picture carrier so as to reduce phase modulation of the received intermediate frequency picture carrier in response to picture signal frequencies over said predetermined range.

2. An acoustic surface wave filter according to claim 1 wherein said predetermined range of frequencies comprises at least about twice the frequency range of the composite baseband audio component of the received television signal.

3. An acoustic surface wave filter according to claim 2 wherein said intermediate frequency picture carrier is at a frequency of 45.75 MHz and wherein said predetermined range of frequencies comprises about 200 KHz centered about 45.75 MHz.

4. An acoustic surface wave filter according to claim 2 wherein said input transducer comprises a plurality of uniform interdigitated fingers and said output transducer comprises a plurality of interdigitated fingers having an apodization pattern corresponding to the Fourier transform of said intermediate frequency response characteristic.

5. An acoustic surface wave filter according to claim 4 wherein said output transducer apodization pattern comprises a centrally located major lobe flanked on either side by a series of three secondary lobes which are mirror images of each other.

6. An acoustic surface wave intermediate frequency filter for an intercarrier sound television receiver comprising a substrate having formed thereon an input transducer for receiving an intermediate frequency television signal having an intermediate frequency picture carrier and an output transducer, one of said transducers comprising a plurality of uniform interdigitated fingers and the other transducer having an apodization pattern for establishing for said filter a television signal intermediate frequency response characteristic including a Nyquist slope portion centered about said intermediate frequency picture carrier, said Nyquist slope portion of the intermediate frequency response characteristic being characterized by a substantially constant gain response over a range of frequencies centered about said intermediate frequency picture carrier and equal to at least about twice the frequency range of the composite baseband audio component of the received television signal.

7. An acoustic surface wave filter according to claim 6 wherein said intermediate frequency picture carrier is at a frequency of 45.75 MHz and wherein said range of frequencies comprises about 200 KHz.

* * * * *